United States Patent
Morelle et al.

(10) Patent No.: US 8,822,880 B2
(45) Date of Patent: Sep. 2, 2014

(54) METHOD AND DEVICE FOR CONTROLLING THE POWER TRANSMITTED BY A LASER TO A REFERENCE POINT, SOLDERING DEVICE AND METHOD

(75) Inventors: Jean-Michel Morelle, Beaugency (FR); Laurent Vivet, Bois d'Arcy (FR)

(73) Assignee: Valeo Etudes Electroniques, Creteil (FR)

( * ) Notice: Subject to any disclaimer, the term of this patent is extended or adjusted under 35 U.S.C. 154(b) by 1627 days.

(21) Appl. No.: 12/308,411

(22) PCT Filed: Jun. 16, 2006

(86) PCT No.: PCT/FR2006/001374
§ 371 (c)(1),
(2), (4) Date: Jul. 23, 2009

(87) PCT Pub. No.: WO2007/144477
PCT Pub. Date: Dec. 21, 2007

(65) Prior Publication Data
US 2010/0000979 A1  Jan. 7, 2010

(51) Int. Cl.
  *B23K 26/06* (2014.01)
  *B23K 1/005* (2006.01)
(52) U.S. Cl.
  USPC ............. 219/121.62; 219/121.6; 219/121.61; 219/121.73; 219/121.85
(58) Field of Classification Search
  USPC ............. 219/121.61, 121.62, 121.63, 121.64, 219/121.65, 121.66, 121.6, 121.85, 121.73, 219/121.83; 372/26, 29.021, 43.01
  See application file for complete search history.

(56) References Cited

U.S. PATENT DOCUMENTS

| | | | |
|---|---|---|---|
| 4,684,796 A | 8/1987 | Johnson | |
| 4,930,901 A | 6/1990 | Johnson et al. | |
| 6,339,604 B1 * | 1/2002 | Smart | 372/26 |
| 6,831,936 B1 * | 12/2004 | Smart | 372/26 |
| 6,881,261 B2 * | 4/2005 | Ueda | 117/89 |
| 2004/0084426 A1 | 5/2004 | Okada | |
| 2005/0109746 A1 * | 5/2005 | Laue et al. | 219/121.85 |
| 2007/0073279 A1 * | 3/2007 | Rowe et al. | 606/11 |

FOREIGN PATENT DOCUMENTS

| | | | |
|---|---|---|---|
| DE | 38 20 848 A1 | | 4/1989 |
| DE | 10015938 A1 * | | 10/2001 |
| GB | 1 250 847 | | 10/1971 |
| JP | 58-151082 A | * | 9/1983 |
| JP | A-58-212889 | | 12/1983 |
| JP | 61-212019 A | * | 9/1986 |
| JP | 03-161163 A | * | 7/1991 |

* cited by examiner

*Primary Examiner* — Geoffrey S Evans
(74) *Attorney, Agent, or Firm* — Oliff PLC

(57) ABSTRACT

In accordance with said control method, the transmission of the laser beam is periodically interrupted with the aid of means for masking the laser beam placed between the reference point and a source of the laser beam. Moreover, the transmission power of the source of the laser beam is varied between the minimum and maximum values, such that the emission times of the source of the laser beam at the minimum power substantially coincide with the masking times of the laser beam via the masking means. Preferably, the minimum value is at least equal to 10% and the maximum value at most equal to 90% of a maximum emission power of the source of the laser beam.

24 Claims, 2 Drawing Sheets

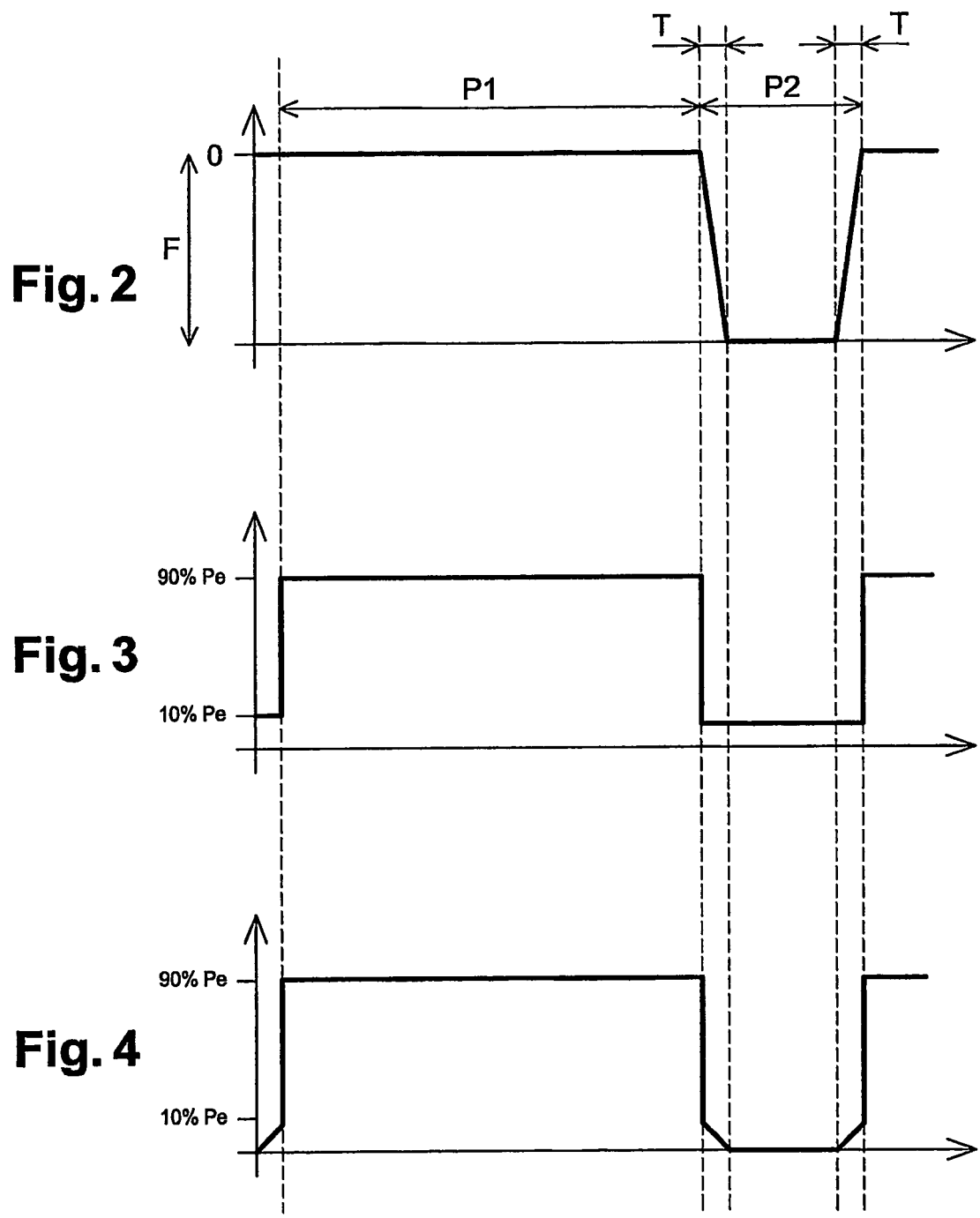

METHOD AND DEVICE FOR CONTROLLING THE POWER TRANSMITTED BY A LASER TO A REFERENCE POINT, SOLDERING DEVICE AND METHOD

The present invention concerns a method and device for controlling the power transmitted by a laser beam to a reference point and a method and device for soldering, in particular a member to a support.

It applies more particularly to soldering a semi-conductor chip to a support comprising a metal part, it being possible to surround the metal part, at least partially, by a part made of synthetic material intended to electrically insulate the metal part.

In a conventional manner, the solder consists of a soldering paste or a thin strip cut up into discs or rectangles which is inserted between the member to be soldered, for instance a semi-conductor chip, and the support.

The solder is generally made of a material such as a lead-tin alloy which has a melting point lower than the melting point of the semi-conductor chip and the support it is being soldered onto.

Consequently, when the assembly consisting of the chip, solder and support is heated to the melting point of the solder, the solder melts and on solidifying enables to assemble the chip to the support.

A device for soldering a member to a support comprising first and second opposite sides, the member to be soldered being intended to be attached to the first side of the support, the soldering device being of a type comprising a laser beam source emitting a beam onto the second side of the support, substantially at the position of the member to be soldered, is already known in the state of the art.

This type of soldering device is described for example in GB-A-1 250 847. This patent therefore proposes applying a laser beam on the second side of the support. The heat produced by the laser beam propagates across the thickness of the support. When the solder reaches its melting point, it melts and enables the member to be soldered onto the first side of the support. The support described in the document is made of a ceramic material.

However, it is desirable with the previously described type of device to be able to solder a member such as a semi-conductor chip to a bi-material support comprising a metal part surrounded by a synthetic material (plastic) forming an electrical insulation.

The part made of synthetic material generally has a lower melting point than that of the solder. As a consequence, since the heat also propagates laterally across the support, the part made of synthetic material could be damaged when soldering the chip onto the support unless the power transmitted to the support by the laser beam is controlled effectively.

A method for controlling the power transmitted by a laser beam to a reference point is already known in the state of the art, in particular according to GB-A-1 250 847, of a type in which the transmission of the laser beam is periodically interrupted with means for masking the laser beam placed between the reference point and a source of the laser beam.

However, the control method described in GB-A-1 250 847 does not allow sufficiently precise control of the power transmitted by the laser beam to the reference point.

In GB-A-1 250 847 the power transmitted to the reference point by the laser beam is controlled by masking means situated between the laser beam source and the reference point, comprising a disc in which an angular sector forming a window is cut out allowing the laser beam to periodically pass through when the disc is rotated.

In GB-A-1 250 847, the intervals when the power transmitted by the laser beam is interrupted are adjusted by adjusting the angular speed of rotation of the disc and/or the angle of the disc window.

However the masking means proposed in GB-A-1 250 847 have the disadvantage of covering and uncovering the laser beam progressively over a transient period of time during which only partial masking of the laser beam occurs.

This transient period may be relatively long and is variable since it is subject to the effects of mechanical wear in the components which constitute the masking means.

Consequently, it is difficult to control the power transmitted to the reference point by the laser beam since, during these transient periods, the power transmitted varies progressively from a maximum value to zero and this power excursion may be relatively large.

The aim of the invention is to optimise control of the power transmitted by the laser beam to a reference point situated for example on a bi-material metal-plastic support, notably to limit lateral propagation of heat through the bi-material support and therefore to protect the part of the support made of synthetic material from high temperatures.

To this end, the invention concerns a control method of the above-mentioned type, characterised in that the emissive power of the laser beam source is varied between minimum and maximum values so that the emission intervals of the laser beam source at minimum power substantially coincide with the intervals during which the laser beam is masked by the masking means, the minimum value being equal to at least 10% of the maximum emissive power of the laser beam source.

Since the masking interval substantially coincides with the emission interval of the laser beam source at minimum power, the transient period during which the laser beam is partially masked corresponds to an interval during which the laser beam is at minimum power.

Thus the power excursion during the transient period is reduced, providing precise control of the power transmitted to the reference point and limiting lateral propagation of heat through the support.

Preferably, the maximum value is equal to at most 90% of the maximum emissive power of the laser beam source. In this case, the power transmitted by the laser beam to the reference point also varies between a minimum value equal to at least 10% and a maximum value equal to at most 90% of a maximum transmission power of the laser beam source.

Thus, by considering that the emissive power is varied between minimum and maximum values corresponding respectively to 10% and 90% of the maximum emissive power of the laser source, during the period when the beam is partially masked the power transmitted to the reference point cannot exceed 10% of the maximum power transmitted by the laser beam to the reference point.

In particular, the laser source may be a laser diode, for example of an infrared type. In this case, to preserve the lifetime of the laser diode, the emissive power of the diode is varied between a minimum value of 10% and a maximum value of 70% of the laser diode's maximum emissive power.

The method of controlling the transmitted power according to the invention may in addition comprise the following optional characteristics:

the variations of the power transmitted to the reference point by the laser beam and the means for masking the light beam are controlled with computerised pilot means;

the pilot means are slaved using means for measuring the temperature of a member in thermal contact with the reference point;

the laser beam is focused on the reference point.

The invention also concerns a device for controlling the power transmitted by a laser beam to a reference point, of the type comprising a laser source emitting the laser beam, means for masking the laser beam designed to periodically interrupt the laser beam during the masking intervals, characterised in that it comprises means for controlling the emissive power of the laser beam source between minimum and maximum values so that the emission intervals of the laser beam source at minimum power substantially coincide with the intervals in which the laser beam is masked by the masking means, the minimum value being at least equal to 10% of the maximum emissive power of the laser beam source.

The device for controlling the power transmitted according to the invention may in addition comprise the following optional characteristics:

the laser source comprises a laser diode, for example of an infrared type;

the device comprises computerised means for piloting the control means for the power transmitted by the laser beam to the reference point and regulating the means for masking the laser beam;

the pilot means are slaved to the temperature of at least one zone whose temperature is influenced by that of the reference point using means for measuring this temperature connected to the pilot means;

the temperature measuring means comprise an infrared pyrometer comprising means for forming an infrared image of the zone.

The invention further concerns a device for soldering a member to a support comprising first and second opposite sides, the member to be soldered being intended to be attached to the first side of the support, the soldering device being of a type that comprises a laser beam source emitting a beam onto the second side of the support, substantially at the position of the member being soldered, characterised in that it comprises the pilot device as defined above to piloting the power transmitted by the laser beam to a reference point forming a point where the laser beam is focused on the second side.

The soldering device according to the invention may in addition comprise the following optional characteristics:

the device comprises guiding means, including an optical fiber and upstream means for focusing the beam in an upstream end of the optical fiber to guide the laser beam from the masking means to the reference point;

the device comprises downstream means for focusing the laser beam emitted by a downstream end of the optical fibre on the reference point.

The invention also concerns a method for soldering a member onto a support comprising a metal part at least partially surrounded by a part made of synthetic material, the metal part comprising first and second opposite sides, the member to be soldered being intended to be attached to the first face of the metal part, characterised in that the member is soldered onto the metal part of the support by means of the soldering device as defined above, the laser beam being focused onto the second side of the metal part.

The soldering method according to the invention may in addition comprise the following optional characteristics:

the member is a semi-conductor chip;

the metal part of the support is intended to be in electrical contact with a connector of an electrical member, notably an alternator terminal in an automobile vehicle, the part made of synthetic material electrically insulating the metal part;

the soldering device comprising a control system as defined earlier, the pilot means being slaved to the temperature of a first zone whose temperature is influenced by that of the reference point, this first zone being located on a part of the surface of the member to be soldered;

the pilot means are slaved to the temperature of a second zone whose temperature is influenced by that of the reference point, this second zone being located on a part of the surface of the support, in particular on the metal part near the part made of synthetic material.

It will be easier to understand the invention on reading the description below, given as an example and referring to the drawings, on which:

FIG. 2 is a graph showing the change in state of the laser beam masking means as a function of time;

FIG. 3 is a graph showing the change in power emitted by a laser beam source as a function of time;

FIG. 4 is a graph showing the change in power transmitted to a reference point by the laser beam as a function of time.

FIG. 1 shows a soldering device according to the invention, designated by the general reference 10.

Figure 1:
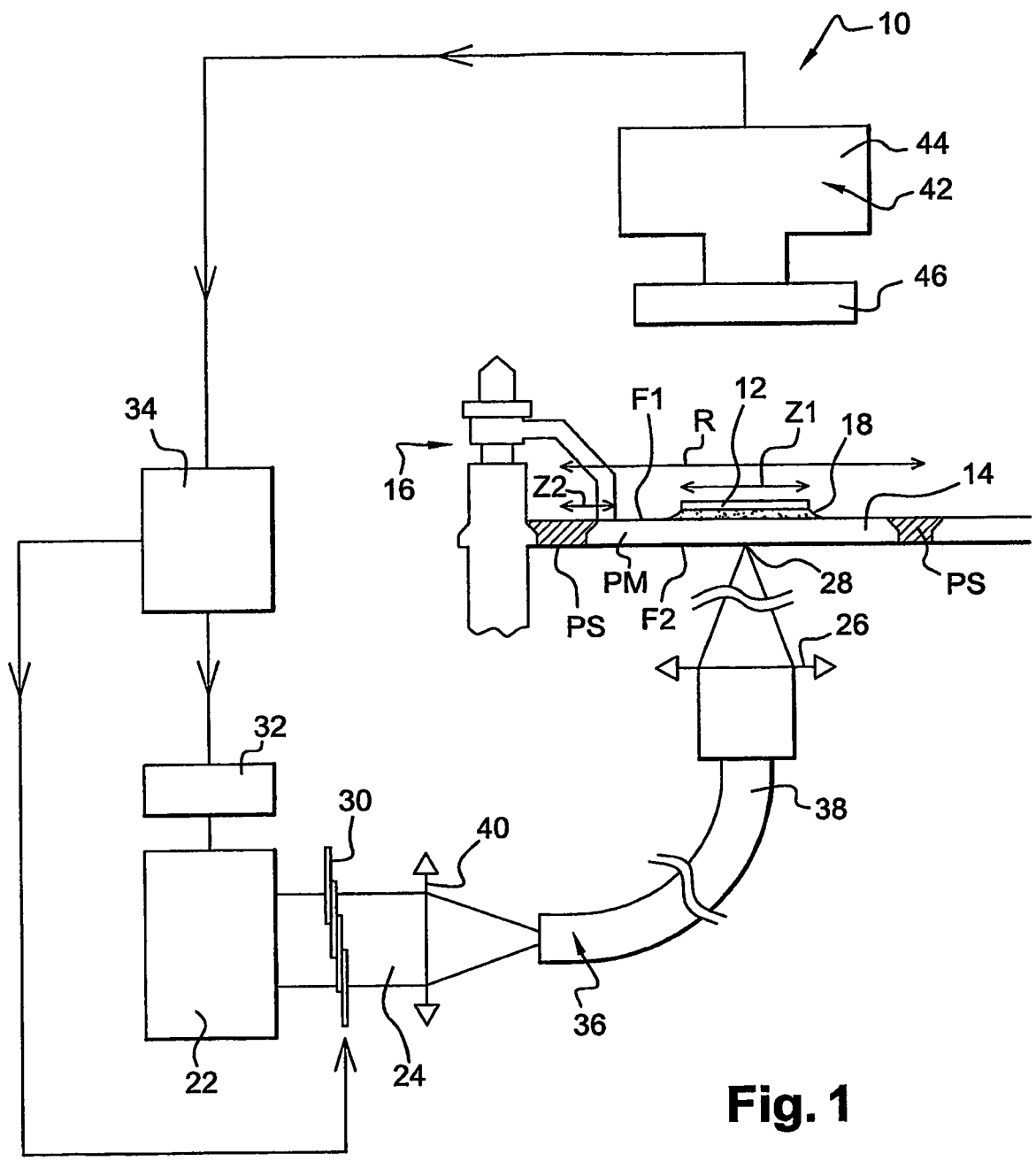
FIG. 1 is a schematic view of a device for soldering a member onto a support according to the invention.

The device 10 is used to solder a member 12 to a support 14 intended to be connected to an electrical connector 16 of an automobile vehicle alternator (not shown).

In the example described, member 12 is a conventional semi-conductor chip.

In addition, in the example described, support 14 comprises a metal part PM, in particular copper, at least partially surrounded by a part PS made of synthetic material (plastic).

The metal part PM comprises first F1 and second F2 opposite sides, member 12 being intended to be attached to the first side F1. Preferably, side F1 is plated with a thin layer of nickel.

The metal part PM ensures good thermal and electrical conduction. It is electrically connected to connector 16. The synthetic part PS electrically insulates the metal part PM.

A material forming solder 18 is inserted between the semi-conductor chip 12 and the support 14. In a conventional manner, the solder 18 consists of a soldering paste or a thin strip cut into discs or rectangles.

The heat used to melt the solder 18 is provided by the energy from a laser source 22 emitting a beam 24.

The laser source 22 may comprise, for example, a laser diode emitting a laser beam of an infrared type for example.

The laser beam 24 is focused by downstream focusing means 26 onto a reference point 28 situated on the second side F2 of the metal part PM of the support 14, at the position of the member 12.

To control the power transmitted by the laser beam 24, the device 10 comprises firstly means 30 for masking laser beam 24 intended to periodically interrupt the transmission of laser beam 24 and secondly means 32 for controlling the emissive power of the laser source 22.

The masking means 30 comprise for example a conventional type of diaphragm.

The masking means 30 are said to be "open" when the laser beam 24 is not masked, so that all the beam power is transmitted, and "closed" otherwise.

The control means 32 and the masking means 30 are controlled by computerised means 34, by a computer for example.

In order to allow more space near the support 14, the laser source 22 is kept some distance away from this support 14. Means 36 guide the laser beam 24 from the source 22 to the reference point 28.

In the example illustrated, the means 36 comprise an optical fiber 38 and upstream means 40 for focusing the laser beam 24 in the optical fiber 38.

If necessary, the optical fiber 38 may be up to 50 meters long to allow a relatively long distance between the support 14 and the large equipment items such as the source 22 and the diaphragm 30.

To optimise control of the power transmitted by the laser beam 24, the pilot means 34 are slaved to the temperature of at least one zone whose temperature is influenced by that of the reference point 28, by temperature measuring means 42 connected to the pilot means 34.

In the example illustrated, the pilot means 34 are slaved to the temperature of the first zone Z1 and second zone Z2 whose temperature is influenced by that of the reference point 28.

The first zone Z1 is located on a part of the surface of member 12, for example on an area of this member 12 opposite that in contact with the solder 18. The member 12 is in thermal contact with the reference point 28 through the solder 18 and the metal part PM of the support.

The second zone Z2 is located on a part of the surface of the support 14, in particular on side F1 of the metal part PM, near the part made of synthetic material PS.

The temperature measuring means 42 may comprise an infrared pyrometer 44 including a conventional camera and means 46 for forming an infrared image of a region R encompassing zones Z1 and Z2.

The means 46 may, for example, comprise a wide angle objective lens matched to the dimensions of region R with sufficient enlargement to obtain good resolution of the relevant zones or component, for instance the semi-conductor chip 12.

In accordance with the soldering method of the invention, the laser beam 24 is focused on the reference point 28 and the power transmitted by the laser beam 24 to this reference point 28 is controlled firstly by periodically interrupting the transmission of the laser beam 24 with the masking means 30 and secondly by varying the emissive power of the source 22 of the laser beam 24 between minimum and maximum values so that the emission intervals of the source 22 of the laser beam 24 at minimum power substantially coincide with the intervals in which the laser beam 24 is masked by the masking means 30.

The word "periodically" must be understood in the context of the invention as meaning "in a more or less regular fashion".

By considering the graph of change in state of the laser beam 24 masking means 30 as a function of time shown in FIG. 2, a period P1 during which the masking means 30 are in the open state "O" and a period P2 during which the masking means 30 are in the closed state "F can be seen".

Note that the period P2 comprises transient sub-periods T during which the means 30 partially mask the laser beam 24.

Preferably, P1 is between 500 and 1000 ms and P2 is between 200 and 500 ms. Generally, in this case, T is between 50 and 100 ms.

By considering the graph of change in power emitted by the laser source 22 shown in FIG. 3, it can be seen that the emission intervals of the laser beam 24 source 22 at minimum power substantially coincide with the laser beam 24 masking period P2. It can also be seen that, preferably, the emissive power of the laser beam 24 source 22 is varied between the minimum value of 10% and the maximum value of 90% of the maximum emissive power Pe of the laser beam 24 source 22.

As a variant, other minimum and maximum values are possible. Preferably, care will be taken to ensure that the minimum value is equal to at least 10% and the maximum value equal to at most 90% of the maximum emissive power Pe of the laser beam 24 source 22.

In addition, by considering the graph of power transmitted by the laser beam 24 to the reference point 28 shown in FIG. 4, it can be seen that the power transmitted by the laser beam 24 to the reference point 28 is:
 equal to 90% of the maximum transmission power Pt of the laser beam 24 during the period P1, and
 zero during the period P2 except during sub-periods T (during sub-periods T, in fact, the power transmitted varies between a value of 10% of the maximum transmission power Pt and zero).

As a variant, if the source 22 is a laser diode, for example of an infrared type, the emissive power of the laser diode emitting the laser beam 24 may be varied between a minimum value of 10% and a maximum value of 70% of the laser diode's maximum emissive power Pe to preserve the lifetime of the laser diode. During the period P1, the power transmitted by the laser beam 24 to the reference point 28 is then equal to 70% of the maximum transmission power Pt of the laser beam 24.

Consequently, since the emissive power of the laser beam 24 source 22 varies between minimum and maximum values in such a way that the emission intervals of the laser beam 24 source 22 at minimum power substantially coincide with the intervals during which the laser beam 24 is masked by the masking means 30, control of the transmitted power is optimised, in particular during the transient sub-periods T whose durations may depend, in particular, on wear in the masking means 30.

The power pulses transmitted shown in FIG. 4 enable the power of the laser beam 24 transmitted to the reference point 28 to be controlled effectively. If necessary, the masking means 30 may be kept closed and the power emitted by the source 22 maintained at a value of 10% of Pe, to change in complete safety the position where the laser beam 24 is focused, in order to solder another member.

The soldering method according to the invention embodied by the device 10 will be described in more detail below.

Initially, the masking means 30 are considered to be open. This state corresponds to the period P1 in the graphs in FIGS. 2, 3 and 4. The power emitted by the laser beam 24 source 22 corresponds in this case to a maximum value of 90% of the maximum emissive power Pe of the laser beam 24 source 22.

The power transmitted by the laser beam 24 to the reference point 28 is then equal to 90% of the maximum transmission power Pt.

The heat supplied by the energy of the laser source 22 to the reference point 28 propagates through the support 14 in particular:
 from side F2 to side F1 of the metal part PM until it reaches the solder 18, the semi-conductor chip 12 and the zone Z1 located on this chip 12, and
 substantially parallel to sides F1 and F2 to reach the zone Z2 of side F1 near the part made of synthetic material PS.

The temperature of zone Z1 and Z2 therefore increases.

The pilot means 34 are slaved to the temperature of zones Z1 and Z2, measured by the means 42, to change the ratio between P1 and P2 as a function of these temperatures. For example, when the temperature of zone Z1 reaches the melting point of the solder 18 or when the temperature of zone Z2 reaches a critical temperature which could damage the part made of synthetic material PS, the means 34 control the means 30 and the means 32 to decrease P1 and increase P2, thereby reducing the power received by the reference point 28.

Obviously, as a variant, the pilot means 34 could be slaved to the temperature of a single relevant zone or to the temperatures of more than two relevant zones.

Note that during a transient sub-period T, since the power emitted by the source 22 is at a minimum during this transient sub-period T, the power transmitted to the reference point 28 is always less than or equal to 10% of the maximum transmission power Pt of the laser beam 24 to the reference point 28.

The soldering method according to the invention therefore offers optimum control of the power transmitted by the laser beam 24.

The invention claimed is:

1. A method for controlling power transmitted by a laser beam to a point, the method comprising:
   periodically interrupting transmission of the laser beam with a masking device that masks the laser beam, the masking device being placed between the point and a laser beam source; and
   varying an emissive power of the laser beam source between minimum and maximum values, wherein
      emission intervals of the laser beam source at the minimum power substantially coincide with intervals during which the laser beam is masked by the masking device, and
      the minimum value being equal to at least 10% of a maximum emissive power of the laser beam source.

2. The control method according to claim 1, wherein the laser beam is focused on the point.

3. The control method according to claim 1, wherein a period during which the masking device is in a closed state comprises transient sub-periods during which the laser beam is partially masked.

4. The control method according to claim 1, wherein a period during which the masking device is in an open state is between 500 and 1000 ms.

5. A laser soldering method, wherein power transmitted by a laser beam is controlled using the method of claim 1.

6. The control method according to claim 1, wherein the maximum value is equal to at most 90% of the maximum emissive power of the laser beam source.

7. The control method according to claim 6, wherein the laser beam source is a laser diode, and the emissive power is varied between the minimum value of 10% and the maximum value of 70% of the laser diode's maximum emissive power.

8. The control method according to claim 1, wherein the variations in power transmitted to the point are controlled by the laser beam and the masking device is controlled with a computer.

9. The control method according to claim 8, wherein the computer is slaved to a temperature measuring device that measures one or more zones whose temperature is influenced by a temperature of the point.

10. A device for controlling power transmitted by a laser beam to a point, comprising:
    a laser beam source emitting the laser beam;
    a masking device that masks the laser beam, the masking device being configured to periodically interrupt the laser beam during masking intervals; and
    a computer that controls an emissive power of the laser beam source between minimum and maximum values, wherein
       emission intervals of the laser beam source at the minimum power substantially coincide with the masking intervals in which the laser beam is masked by the masking device, and
       the minimum value being at least equal to 10% of a maximum emissive power of the laser beam source.

11. The control device according to claim 10, wherein the laser source comprises a laser diode.

12. The control device according to claim 10, wherein the computer regulates the laser beam power transmitted by the laser beam source and the masking device.

13. The control device according to claim 10, wherein the masking intervals include transient sub-periods during which the laser beam is partially masked.

14. The control device according to claim 10, wherein a period during which the masking device is in an open state is between 500 and 1000 ms.

15. The control device according to claim 10, wherein the computer is slaved to a temperature of at least one zone whose temperature is influenced by a temperature that of the point, using a temperature measuring device.

16. The control device according to claim 15, wherein the temperature measuring device comprises an infrared pyrometer that forms an infrared image of the zone.

17. A device for soldering a member to a support comprising first and second opposite sides, the member to be soldered being intended to be attached to the first side of the support, the soldering device comprising:
    a laser beam source emitting a beam onto the second side of the support, substantially at a position of the member to be soldered; and
    a device for controlling power transmitted by a laser beam to a point forming a point where the laser beam is focused on the second side, the device including:
       a masking device that masks the laser beam, the masking device being configured to periodically interrupt the laser beam during masking intervals; and
       a computer that controls an emissive power of the laser beam source between minimum and maximum values, wherein
          emission intervals of the laser beam source at the minimum power substantially coincide with the masking intervals in which the laser beam is masked by the masking device, and
          the minimum value being at least equal to 10% of a maximum emissive power of the laser beam source.

18. The soldering device according to claim 17, comprising a guiding device, including an optical fiber and an upstream device that focuses the beam in an upstream end of the optical fiber to guide the laser beam from the masking device to the point.

19. The soldering device according to claim 18, comprising a downstream device that focuses the laser beam emitted by a downstream end of the optical fiber on the point.

20. A method for soldering a member onto a support comprising a metal part at least partially surrounded by a part made of synthetic material, the metal part comprising first and second opposite sides, the member to be soldered being intended to be attached to the first side of the metal part, the member being soldered onto the metal part of the support by a soldering device, the soldering device including:
    a laser beam source emitting a beam onto the second side of the metal part, substantially at a position of the member to be soldered, the laser beam being focused on the second side of the metal part; and a device for controlling power transmitted by the laser beam to a point forming a point where the laser beam is focused on the second side, including:

a masking device that masks the laser beam, the masking device being configured to periodically interrupt the laser beam during masking intervals; and a computer that controls an emissive power of the laser beam source between minimum and maximum values, wherein emission intervals of the laser beam source at the minimum power substantially coincide with the masking intervals in which the laser beam is masked by the masking device, and the minimum value being at least equal to 10% of a maximum emissive power of the laser beam source.

21. The soldering method according to claim 20, wherein the member is a semi-conductor chip.

22. The soldering method according to claim 20, wherein the metal part of the support is intended to be in electrical contact with a connector of an electrical member, the part made of synthetic material electrically insulating the metal part.

23. The soldering method according to claim 20, wherein the computer is slaved to the temperature of at least one zone whose temperature is influenced by that of the point, using a temperature measuring device connected to the computer, the method further comprising:

the computer being slaved to the temperature of a first zone whose temperature is influenced by that of the point, the first zone being located on a part of the surface of the member to be soldered.

24. Soldering method according to claim 23, wherein the computer is slaved to the temperature of a second zone whose temperature is influenced by that of the point, the second zone being located on a part of the surface of the support.

* * * * *